United States Patent
Lamprecht

(10) Patent No.: US 10,158,307 B2
(45) Date of Patent: Dec. 18, 2018

(54) METHOD AND DEVICE FOR DETERMINING PHASE CURRENTS AND AN EXCITATION CURRENT OF AN ELECTRICAL MACHINE, AND MOTOR SYSTEM

(71) Applicant: Robert Bosch GmbH, Stuttgart (DE)

(72) Inventor: Dirk Lamprecht, Stuttgart-Rohr (DE)

(73) Assignee: Robert Bosch GmbH, Stuttgart (DE)

( * ) Notice: Subject to any disclaimer, the term of this patent is extended or adjusted under 35 U.S.C. 154(b) by 45 days.

(21) Appl. No.: 14/912,102

(22) PCT Filed: Aug. 5, 2014

(86) PCT No.: PCT/EP2014/066776
§ 371 (c)(1),
(2) Date: Feb. 15, 2016

(87) PCT Pub. No.: WO2015/022231
PCT Pub. Date: Feb. 19, 2015

(65) Prior Publication Data
US 2016/0197569 A1    Jul. 7, 2016

(30) Foreign Application Priority Data

Aug. 15, 2013    (DE) .................. 10 2013 216 224

(51) Int. Cl.
*H02P 6/32*    (2016.01)
*G01R 19/00*    (2006.01)
(Continued)

(52) U.S. Cl.
CPC ............ *H02P 6/32* (2016.02); *G01R 19/0092* (2013.01); *H02M 7/53875* (2013.01); *H02P 21/22* (2016.02); *H02M 2001/0009* (2013.01)

(58) Field of Classification Search
CPC .................................. H02P 6/32; H02P 29/666
See application file for complete search history.

(56) References Cited

U.S. PATENT DOCUMENTS

| 2010/0072980 A1 | 3/2010 | Schmitt et al. |
| 2012/0163046 A1 | 6/2012 | Hibino |

(Continued)

FOREIGN PATENT DOCUMENTS

| CN | 101803175 A | 8/2010 |
| DE | 102005062759 | 7/2007 |

(Continued)

OTHER PUBLICATIONS

International Search Report for Application No. PCT/EP2014/066776 dated Dec. 12, 2014 (English Translation, 3 pages).

*Primary Examiner* — Bickey Dhakal
(74) *Attorney, Agent, or Firm* — Michael Best & Friedrich LLP

(57) ABSTRACT

The invention relates to a method for determining the phase currents through phase windings (12) and an excitation current through an excitation winding (13) of an electrical machine (11), wherein an excitation winding (13) is connected between a star point (14) of the phase windings (12) and a defined reference potential, the method comprising the following steps: —periodic driving of the electrical machine (11) with a predefined pulse pattern (30); —determining a respective measurement current ($I_{mess}$) in a plurality of temporal measuring windows (31, 32, 33) of a measuring period (37), wherein the measurement currents ($I_{mess}$) correspond to currents through one of the phase windings (12) and through one or more parallel connections of a plurality of the phase windings (12); and —determining the phase currents and the excitation current by evaluating the measurement currents ($I_{mess}$) determined during the measuring period (37).

13 Claims, 1 Drawing Sheet

(51) Int. Cl.
*H02M 7/5387* (2007.01)
*H02P 21/22* (2016.01)
*H02M 1/00* (2006.01)

(56) References Cited

U.S. PATENT DOCUMENTS

2013/0293182 A1* 11/2013 Neuburger .............. H02P 27/06
318/716
2014/0132125 A1* 5/2014 Rieger ................... H02K 19/12
310/68 C
2014/0191694 A1* 7/2014 Hallor ...................... H02P 6/18
318/400.32

FOREIGN PATENT DOCUMENTS

| DE | 102006052467 | | 5/2008 | |
|----|---|---|---|---|
| DE | 112008000522 | | 2/2010 | |
| DE | 102010001181 | | 7/2011 | |
| DE | 102010064177 | | 6/2012 | |
| DE | 102011003897 | | 8/2012 | |
| DE | 102011078155 | | 1/2013 | |
| DE | 102011078155 A1 * | 1/2013 | ................ H02P 9/30 |
| WO | 2012089412 | | 7/2012 | |
| WO | 2013000632 | | 1/2013 | |

* cited by examiner

METHOD AND DEVICE FOR DETERMINING PHASE CURRENTS AND AN EXCITATION CURRENT OF AN ELECTRICAL MACHINE, AND MOTOR SYSTEM

BACKGROUND OF THE INVENTION

The present invention relates, in general, to a method and to an apparatus for measuring motor currents in an electrical machine.

Electronically commutated electrical machines with permanent magnets, such as permanent-magnet synchronous motors, are common. Electrical machines of this kind are highly suitable for many applications, but at high rotation speeds have the disadvantage that the field attenuation required in this case leads to an increase in losses and therefore to a reduction in the degree of efficiency. In contrast to this, the field attenuation is achieved in a simple manner by reducing the excitation magnetic field in the case of electrical machines with external or hybrid excitation.

In the case of electrical machines with external excitation, the excitation magnetic field is generated with the aid of a separate field winding whereas, in the case of electrical machines with hybrid excitation, the magnetic field is generated both by permanent magnets and also with the aid of a separate field winding. The field winding serves to direct a static magnetic field toward a rotor body which collects the magnetic flux and guides the magnetic flux in the direction of the stator by means of the rotor poles. One advantage of machines with external or hybrid excitation is that the quantity of permanent-magnet material used is reduced and therefore the costs are lower in comparison to permanent-magnet machines.

The additional field winding typically requires increased circuit complexity. Furthermore, rapid and reliable measurement of the phase currents through the phase windings and of the field current is required in order to regulate and drive both the phase windings and the field windings, this resulting in additional expenditure. It is therefore necessary to optimize the expenditure on connecting the phase windings and the field windings and also on the current measurement operations.

WO 2012/089412 A2 describes a three-phase machine with a field winding which is connected to the star point of the three-phase machine and to the ground of the supply voltage, this already meaning a considerable simplification in the circuit complexity, in particular for the field winding.

DE 10 2006 052467 A1 further discloses how the phase currents of a three-phase machine can be determined with only one measurement resistor, that is to say one shunt.

Furthermore, WO 2013/000632 A2 discloses an extension of the known single-shunt current measurement operation to machines with external or hybrid excitation.

The object is therefore to provide means for determining the phase currents and the field current based on a current measurement operation with only one current measurement apparatus for an electrical machine with hybrid excitation. In the process, the method should be equivalent to or improved in respect of noise development and maximum possible driving level in comparison to the known methods for electrical machines without a field winding.

SUMMARY OF THE INVENTION

This object is achieved by the method for determining phase currents through phase windings and a field current through a field winding of an electrical machine according to the invention and also by the apparatus for determining phase currents through phase windings and a field current through a field winding of an electrical machine, and by the motor system according to the invention.

According to a first aspect, a method for determining phase currents through phase windings and a field current through a field winding of an electrical machine is provided, wherein a field winding is connected between a star point of the phase windings and a specific reference potential, comprising the following steps:

periodically driving the electrical machine with a predefined pulse pattern;

determining in each case one measurement current with only one current measurement apparatus in a plurality of time measurement windows of a measurement period, wherein the measurement currents comprise a current through one of the phase windings and at least one current through one or more parallel circuits of a plurality of the phase windings; and determining the phase currents and the field current by evaluating the measurement currents which are determined during the measurement period.

One idea of the abovementioned method is that of determining the phase currents of the electrical machine and the field current with the aid of only one single current measurement apparatus by virtue of current measurement operations which are carried out in a suitable manner. This is possible, in particular, with connection of the field winding between the star point and a reference potential.

In this way, it is possible to carry out current regulation in a convenient and low-noise manner in an electrical machine, in particular with external or hybrid excitation, with robust and cost-effective electrical interconnection which manages without additional switches and current measurement apparatuses for the field winding.

Furthermore, according to one embodiment, the measurement currents can be measured by means of a measurement resistor (shunt). In this case, the measurement resistor can be arranged between the connection of the specific reference potential and a driver circuit which is intended to switch the phase windings and which is connected to the phase windings.

According to one embodiment, the measurement currents can be determined by means of a current measurement apparatus which is arranged between the specific reference potential and a driver circuit which is intended to switch the phase windings and which is connected to the phase windings.

Furthermore, the electrical machine can be driven by, in particular left-aligned, pulse width modulation signals, wherein, during each measurement window, the number of phase windings, which are each connected to the specific reference potential, is different and the remaining phase windings are each disconnected from the specific reference potential and are instead connected to a potential which is different from the specific reference potential, in particular to a supply voltage connection.

Provision can be made for a measurement current which corresponds to the field current to be determined or for a stored and/or calculated current value to be assumed for the field current, depending on whether all phase windings are connected to the specific reference potential for a prespecified minimum period of time in an actual measurement period, in particular in a time range at the end of a pulse width modulation period.

Furthermore, an assessment as to whether a measurement current which corresponds to a field current is measured in the actual measurement period is performed on the basis of the instantaneous load on the electrical machine.

The electrical machine can have three phase windings, wherein, during each measurement period, the measurement current corresponds to a first phase current in a first measurement window and corresponds to a linear combination of a second phase current with the field current in a second measurement window, and wherein either a current value of the field current, which current value is measured in a third measurement window, or the stored and/or calculated current value of the field current is used, in particular, in order to determine a third phase current.

According to a further aspect, an apparatus for determining the phase currents through phase windings and a field current through a field winding of an electrical machine is provided, in which apparatus a field winding is connected between a star point of the phase windings and a specific reference potential, wherein the apparatus is designed to determine in each case one measurement current in a plurality of time measurement windows of a measurement period in an electrical machine which is periodically driven with a predefined pulse pattern, wherein the measurement currents correspond to currents through one of the phase windings and through one or more parallel circuits of a plurality of the phase windings; and to determine the phase currents and the field current by evaluating the measurement currents which are determined during the measurement period.

According to a further aspect, a motor system is provided, said motor system comprising:

an electrical machine with external or hybrid excitation, which electrical machine has a field winding which is connected between a star point of the phase windings and a specific reference potential;

a driver circuit by means of which electrical energy is supplied to the phase windings and which supplies current to the phase windings in accordance with a pulse pattern;

a current measurement device which is arranged between the driver circuit and the specific reference potential, so that an associated measurement current can be determined in a measurement window, said measurement current flowing through one of the phase windings or a parallel circuit of a plurality of the phase windings altogether in a corresponding manner with respect to a predetermined current direction; and the above apparatus.

Furthermore, the driver circuit can comprise an inverter with a bridge circuit, in particular a B6 bridge circuit.

A drive unit can be provided in order to generate a plurality of time measurement windows in a measurement period of the measurement by means of driving the driver circuit by in each case one or more phase windings being simultaneously coupled to the connection of the specific reference potential in accordance with a predefined pulse pattern.

According to one embodiment, the electrical machine can have three phase windings, wherein, during each measurement period, the measurement current corresponds to a first phase current in a first measurement window and corresponds to a linear combination of a second phase current, which is different from the first phase current, with the field current in a second measurement window. In this case, either a measured current value of the field current or the stored and/or calculated current value of the field current can furthermore be used in order to determine a third phase current using the node law at the star point.

The current measurement apparatus can comprise a measurement amplifier circuit and an analog/digital converter. Furthermore, a minimum time variable of each measurement window can be given by a sum of a minimum dead time of switching elements of the driver circuit, a minimum settling time of the measurement amplifier circuit and a minimum sampling time of the analog/digital converter.

BRIEF DESCRIPTION OF THE DRAWINGS

Embodiments will be explained in greater detail with reference to the drawings and the following description. In the drawings.

Identical or similar components are in each case provided with the same reference symbols.

DETAILED DESCRIPTION

Figure 1:
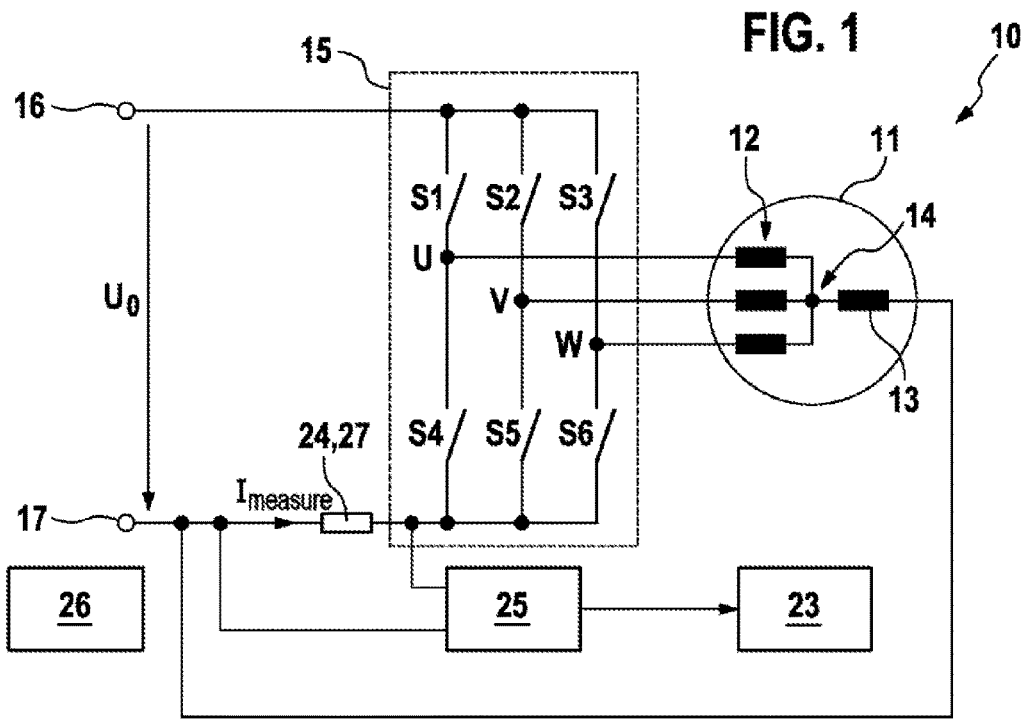
FIG. 1 shows a schematic illustration of a motor system comprising an electrical machine with hybrid excitation.

FIG. 1 schematically illustrates a motor system 10 comprising an electrical machine. The motor system 10 has a three-phase machine with hybrid excitation as electrical machine 11 with three phase windings 12 with the phase connections U, W, V. The phase windings 12 are connected to one another in the electrical machine 11 in star. The electrical machine 11 further has a field winding 13 which serves to generate, or contributes to generating, a magnetic field in the rotor of the electrical machine 11 with hybrid excitation and which is electrically connected to the star point 14.

The phase windings 12 are supplied with corresponding phase voltages by means of a driver circuit 15, here an inverter with six switches S1 to S6 which are connected to one another in the form of a fully controlled 6-pulse bridge (B6) which is known per se. The switches S1 to S6 of the driver circuit 15 are driven by a drive unit 26, wherein the switches S1 to S3 correspond to the pull-up switches, and the switches S4 to S6 correspond to the pull-down switches. The driver circuit 15 has three inverter branches comprising the switches S1 and S4 and, respectively, S2 and S5 and, respectively, S3 and S6. The switches can be designed, for example, in the form of semiconductor switches, in particular as transistors, thyristors, MOSFETs, IGBTs, IGCTs and the like.

At the input end, the driver circuit 15 is provided with a first supply voltage connection 16 and a second supply voltage connection 17 to which a supply voltage $U_0$ can be applied. The two supply voltage connections 16, 17 can be, or can be electrically connected to, outputs of a DC voltage intermediate circuit or a DC voltage source, in particular a lithium-ion battery. The second supply voltage connection 17 can correspond, in particular, to a supply voltage ground.

The field winding 13 is connected between the star point 14 and the second supply voltage connection 17, that is to say the supply voltage ground.

A shunt 24 can be used as current measurement apparatus 27 for current measurement purposes, said shunt being arranged between the second supply voltage connection 17 and an input of the driver circuit 15, which is in the form of a B6 inverter, in order to implement the method described below. In this way, currents from the phase connections U, V, W or the phase windings 12 can be selectively measured depending on which of the lower switches (pull-down switches) S4 to S6 of the driver circuit 15 are closed.

Figure 2:
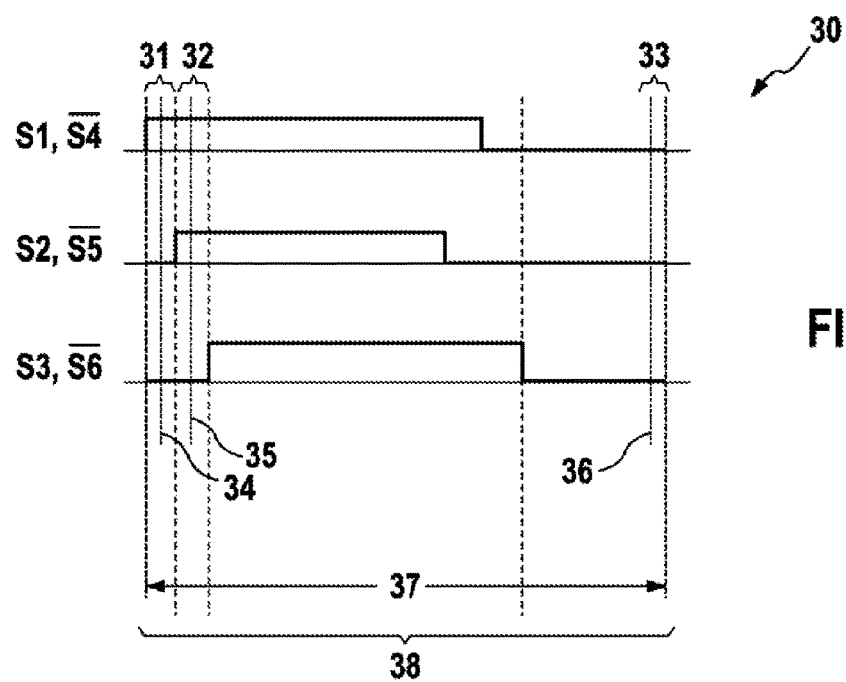
FIG. 2 shows an exemplary pulse pattern for driving the phase connections of the electrical machine with hybrid excitation from FIG. 1.

FIG. 2 illustrates an exemplary pulse pattern 30 for driving the switches S1 to S6 of the driver circuit 15. As shown in FIG. 2, pulse width modulated signals (PWM), which are preferably left-aligned, are used in this case. Driving of the switches S1 and S4 in a switch section of the B6 inverter for supplying the first phase connection U is shown in the upper part of FIG. 2. In this case, the switches S1 and S4 are driven inversely in relation to one another in order to avoid a short circuit, this being indicated in the drawing by the negation bar over reference symbol S4. The central and the lower part of FIG. 2 accordingly show driving of the switches S2 and S5 of the second switch section of the B6 inverter for the second phase connection V and, respectively, the switches S3 and S6 of the third switch section of the B6 inverter for the third phase connection W.

As a result, sinusoidal AC voltages can be generated in particular. Depending on the instantaneous pulse width, the electrical potential of the phase connections U, V, W is adjusted to an actual value which is in each case between the potentials of the connections 16, 17. In particular, the switches S1 to S6 are driven by the drive unit 26 such that an AC voltage is applied as a differential voltage between the two phase windings 12. Therefore, alternating currents are generated in the phase windings 12, said alternating currents in each case adding to an adjustable constant current at the star point 14. The star point 14 is drawn to a specific DC voltage potential (star point potential), which is varied depending on the operating point of the electrical machine 11, by corresponding driving in order to generate a direct field current. The adjustable constant current then corresponds to the direct field current which flows through the field winding 13.

In order to measure the phase currents and the field current, a plurality of time measurement windows 31, 32, 33 are produced in a measurement period 37 of the measurement operation, wherein in each case one measurement current $I_{measure}$ is determined in each measurement window 31, 32, 33, said measurement current flowing through one of the phase windings 12 or a parallel circuit of a plurality of the phase windings 12 overall with respect to a predetermined current direction. In this case, a measurement period 37 corresponds to a pulse width modulation period 38 of the left-aligned pulse width modulation, wherein different drive vectors 34, 35 followed by a zero vector 36 are positioned one after the other.

In order to produce the suitable measurement windows 31, 32, 33, the relevant phase windings 12 are simultaneously coupled to the connection 28 of the specific reference potential in accordance with a predefined pulse pattern 30. Provision can be made, in particular, for in each case the first measurement window 31 to last from the beginning of the measurement period 37 up to a first flank of a first switching signal for a relevant switch (a relevant pair of switches) of a first inverter branch of the B6 inverter, for the second measurement window 32 to last from the first flank of the first switching signal of the relevant switch of the B6 inverter to a first flank of a second switching signal for a switch of a second inverter branch of the B6 inverter, and for the third measurement window 33 to last from a last flank, as seen over all of the switching signals in the relevant measurement period, up to the end of the measurement period 37.

In the example in FIG. 2, the two drive vectors 34, 35 are positioned at the beginning of the pulse width modulation period 38. In contrast to the prior art, it is therefore possible for not only two phase currents, but also a phase current and the sum of another phase current and the field current to be measured. Therefore, the phase current of the first phase winding 12 at the phase connection U is measured in the first measurement window 31. A sum of a second phase current at the phase connection V and the field current through the field winding 13 is measured in the second measurement window 32.

In order to measure the field current in the shunt 24 by measuring the voltage across the shunt 24, all pull-down switches S4, S5, S6 of the inverter or of the driver circuit 15 have to be closed (and accordingly all of the pull-up switches S1, S2, S3 have to be opened), so that the measurement current during a zero vector 36 is measured. This state typically occurs at the end of the pulse width modulation period 38. If the field current is now known by measurement, the second phase current and therefore, by means of the node law at the star point 14, the third phase current too can also be calculated. This takes place by means of an evaluation unit 25 which determines the phase currents and the field current from the respective measurement currents $I_{measure}$ which were determined during the measurement period 37. Therefore, all of the actual values of the phase currents are known and can be supplied to a current control system 23.

Depending on the rotor position, other variants also occur for the measurement currents measured during the drive vectors 34, 35. To this end, the pulse pattern 30 can be adjusted in such a way that driving of the switches S1 to S6 is optimized in such a way that measurement can be performed with as little noise as possible.

If the maximum amplitude of the three-phase voltage system, which connects the inverter or the driver circuit 15 to the machine terminals or phase connections U, V, W, is set and the electrical machine 11 therefore runs at high rotation speeds and under high load, the zero vector 36 at the end of the pulse width modulation period 38 is too short to carry out a measurement of the measurement current $I_{measure}$. The field current cannot be measured in this case.

Provision can therefore be made for the operating state in which excessively short zero vectors 36 occur in the pulse width modulation period 38 to be identified and, in this case, for measurement of the field voltage across the shunt 24 at the end of the pulse width modulation period 38 to be prevented.

However, this is not disadvantageous for adjusting the field current in comparison to a variant with a current sensor in the field coil current path since the star point voltage and therefore the voltage across the field winding 13 can no longer be changed in any case. The zero potential of the three-phase voltage system which connects the driver circuit 15 to the phase connections U, V, W can no longer be varied upward or downward in this case. Therefore, a current control system 23 for the field current has no way of changing the field current by means of the actuating variable "duration of the zero vector 36 of the three-phase voltage system".

Furthermore, the field current is however required for calculating the phase currents from the current values which are measured with the drive vectors 34, 35. Therefore, in this case, instead of the measured value for the field current, a model-based value, in particular a value calculated by software, is used, said value being corrected in an appropriate manner as soon as the field current can be measured again.

The invention claimed is:

1. A method for determining phase currents through phase windings (12) and a field current through a field winding (13) of an electrical machine (11), wherein the field winding (13) is connected between a star point (14) of the phase windings (12) and a specific reference potential (17), and a current measuring apparatus is connected between the connection of the field winding (13) to the specific reference potential (17) and the phase windings (12), the method comprising:
  periodically driving the electrical machine (11) with a predefined pulse pattern (30);
  determining in each case one measurement current ($I_{measure}$) by the current measuring apparatus in a plurality of time measurement windows (31, 32, 33) of a measurement period (37), wherein the measurement currents ($I_{measure}$) comprise a current through one of the phase windings (12) and at least one current through one or more parallel circuits of a plurality of the phase windings (12); and
  determining the phase currents and the field current by the current measuring apparatus by evaluating the measurement currents ($I_{measure}$) which are determined during the measurement period (37);
  wherein the electrical machine (11) is driven by pulse width modulation signals, wherein, during each measurement window (31, 32, 33), the number of phase windings (12), which are each connected to the specific reference potential (17), is different and the remaining phase windings (12) are each connected to a potential which is different from the specific reference potential; and
  a measurement current ($I_{measure}$) which corresponds to the field current is determined by the current measuring apparatus, depending on whether all phase windings (12) are connected to the specific reference potential (17) for a prespecified minimum period of time in an actual measurement period (37).

2. The method as claimed in claim 1, wherein an assessment as to whether the measurement current ($I_{measure}$) which corresponds to the field current is measured in the actual measurement period (37) and is performed on the basis of the instantaneous load on the electrical machine (11).

3. The method as claimed in claim 1, wherein the electrical machine (11) has three phase windings (12), wherein, during each measurement period (37), a first phase current is measured as a measurement current ($I_{measure}$) in a first measurement window (31), and a linear combination of a second phase current with the field current is measured as a measurement current ($I_{measure}$) in a second measurement window (32), and wherein a current value of the field current, which current value is measured in a third measurement window (33), or the a stored and/or calculated current value of the field current is used.

4. The method as claimed in claim 3, wherein the current value of the field current, or the stored and/or calculated current value of the field current is used to determine a third phase current.

5. The method as claimed in claim 1, wherein the pulse width modulation signals are left-aligned.

6. The method as claimed in claim 1, wherein the remaining phase windings (12) are each connected to a supply voltage connection (16).

7. The method as claimed in claim 1, wherein a stored and/or calculated current value is assumed for the field current, depending on whether all phase windings (12) are connected to the specific reference potential (17) for a prespecified minimum period of time in the actual measurement period (37).

8. The method as claimed in claim 1, wherein the prespecified minimum period of time in the actual measurement period (37) is in a time range at the end of a pulse width modulation period (38).

9. An apparatus for determining phase currents through phase windings (12) and a field current through a field winding (13) of an electrical machine (11), in which the field winding (13) is connected between a star point (14) of the phase windings (12) and a specific reference potential, the apparatus comprising:
  a current measuring apparatus is connected between the connection of the field winding (13) to the specific reference potential (17) and the phase windings (12), wherein the apparatus is configured to perform the steps of:
  determining in each case one measurement current ($I_{measure}$) in a plurality of time measurement windows (31, 32, 33) of a measurement period (37) in the electrical machine (11) which is periodically driven with a predefined pulse pattern (30), wherein the measurement currents ($I_{measure}$) correspond to currents through one of the phase windings (12) and through one or more parallel circuits of a plurality of the phase windings (12); and
  determining the phase currents and the field current by evaluating the measurement currents ($I_{measure}$) which are determined during the measurement period (37)
  driving the electrical machine (11) by pulse width modulation signals, wherein, during each measurement window (31, 32, 33), the number of phase windings (12), which are each connected to the specific reference potential (17), is different and the remaining phase windings (12) are each connected to a potential which is different from the specific reference potential; and
  determining a measurement current ($I_{measure}$) which corresponds to the field current, depending on whether all phase windings (12) are connected to the specific reference potential (17) for a prespecified minimum period of time in an actual measurement period (37).

10. A motor system (10), comprising:
  an electrical machine (11) with external or hybrid excitation, which electrical machine has a field winding (13) which is connected between a star point (14) of the phase windings (12) and a specific reference potential;
  a driver circuit (15) by which electrical energy is supplied to the phase windings (12) and which supplies current to the phase windings (12) in accordance with a pulse pattern (30);
  a current measurement device (24) which is arranged between the driver circuit (15) and the specific reference potential, so that an associated measurement current ($I_{measure}$) is determined in a measurement window (31, 32, 33), said measurement current flowing through one of the phase windings (12) or a parallel circuit of a plurality of the phase windings (12) altogether in a corresponding manner with respect to a predetermined current direction; and the apparatus as claimed in claim 9.

11. The motor system (10) as claimed in claim 10, wherein the driver circuit (15) comprises an inverter with a bridge circuit.

12. The motor system (10) as claimed in claim 10, wherein a drive unit (26) is provided in order to generate a plurality of time measurement windows (31, 32, 33) in the measurement period (37) of the measurement operation by driving the driver circuit (15) by in each case one or more phase windings (12) being simultaneously coupled to the connection (28) of the specific reference potential in accordance with a predefined pulse pattern (30).

13. The motor system (10) as claimed in claim 11, wherein the bridge circuit, is a B6 bridge circuit.

\* \* \* \* \*